(12) United States Patent
Lin et al.

(10) Patent No.: US 9,729,147 B2
(45) Date of Patent: Aug. 8, 2017

(54) INDUCTION KEY, CALIBRATION SYSTEM FOR INDUCTION KEYS, AND CALIBRATION METHOD FOR INDUCTION KEYS

(71) Applicant: HON HAI PRECISION INDUSTRY CO., LTD., New Taipei (TW)

(72) Inventors: Yu-Tsung Lin, New Taipei (TW); Po-Hsien Liu, New Taipei (TW)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 298 days.

(21) Appl. No.: 14/680,541

(22) Filed: Apr. 7, 2015

(65) Prior Publication Data
US 2016/0033612 A1    Feb. 4, 2016

(30) Foreign Application Priority Data
Jul. 31, 2014   (TW) .............................. 103126309 A

(51) Int. Cl.
*G01R 33/09*  (2006.01)
*G01R 33/02*  (2006.01)
*H03K 17/97*  (2006.01)

(52) U.S. Cl.
CPC ..... *H03K 17/97* (2013.01); *H03K 2017/9706* (2013.01); *H03K 2217/94026* (2013.01); *H03K 2217/9658* (2013.01)

(58) Field of Classification Search
CPC .... G01R 33/09; G01R 33/02; G01R 33/0052; G01R 33/093; G01R 33/096; G01R 33/0011; G01R 33/07; G01R 33/098; H04Q 2209/40; H04Q 2209/43; H04Q 2209/823; H04Q 2209/47; H04Q 2209/50; H04Q 2209/70
USPC ....... 324/244, 202, 207.15, 654, 76.75, 339, 324/313, 331, 345, 381, 210, 213, 214, 324/219, 228–232, 246–263, 754.17, 324/754.29
See application file for complete search history.

(56) References Cited

U.S. PATENT DOCUMENTS

| | | | | |
|---|---|---|---|---|
| 4,916,443 A | * | 4/1990 | Barrett | G07C 1/32 340/5.33 |
| 5,638,270 A | * | 6/1997 | Maeda | B60R 25/04 180/287 |
| 7,301,438 B2 | * | 11/2007 | Stasi | B60R 25/21 307/10.5 |

(Continued)

*Primary Examiner* — Jay Patidar
*Assistant Examiner* — Taqi Nasir
(74) *Attorney, Agent, or Firm* — Steven Reiss

(57) ABSTRACT

A calibration system for induction keys includes a signal source and a computing device. The signal source is configured to generate a low frequency (LF) signal and a magnetic field signal at intervals. The computing device is configured to receive the magnetic field signal transmitted by an induction key when the induction key senses the LF signal. The computing device is configured to obtain a magnetic field strength from the magnetic field signal, and then comparing the magnetic field strength with a pre-stored standard strength of the magnetic field to achieve an offset. The computing device sends the offset value to the induction key and enables the induction key to get a calibrated strength value of the magnetic field according to the offset value. This disclosure further provided an induction key and a calibration method.

7 Claims, 3 Drawing Sheets

(56) References Cited

U.S. PATENT DOCUMENTS

| | | | |
|---|---|---|---|
| 9,404,988 B2* | 8/2016 | Stephanson | G01R 33/10 |
| 9,563,800 B2* | 2/2017 | Chen | G06K 9/00013 |
| 2006/0007005 A1* | 1/2006 | Yui | G07C 1/10 |
| | | | 340/573.4 |
| 2007/0057792 A1* | 3/2007 | Alden | G06F 3/0202 |
| | | | 340/572.1 |
| 2009/0256674 A1* | 10/2009 | Lee | B60R 25/24 |
| | | | 340/5.6 |
| 2014/0285183 A1* | 9/2014 | Stephanson | G01R 33/10 |
| | | | 324/202 |

* cited by examiner

INDUCTION KEY, CALIBRATION SYSTEM FOR INDUCTION KEYS, AND CALIBRATION METHOD FOR INDUCTION KEYS

FIELD

The subject matter herein generally relates to a calibration system and a calibration method for induction keys.

BACKGROUND

The use of passive keyless entry (PKE) systems in automobiles has increased significantly recently. The PKE systems have increased the convenience of entering an automobile, especially when the vehicle operator's hands are full. They also are more secure than prior key-based security systems. A PKE system enables a driver to lock/unlock an automobile using an induction key. The induction key can sense and identify a low frequency (LF) signal transmitted by the automobile, and use an ultra high frequency (UHF) signal emitter to lock/unlock the automobile. The accuracy and stability of sensing the LF signal by the induction key is important.

BRIEF DESCRIPTION OF THE DRAWINGS

Implementations of the present technology will now be described, by way of example only, with reference to the attached figures.

DETAILED DESCRIPTION

Figure 1:
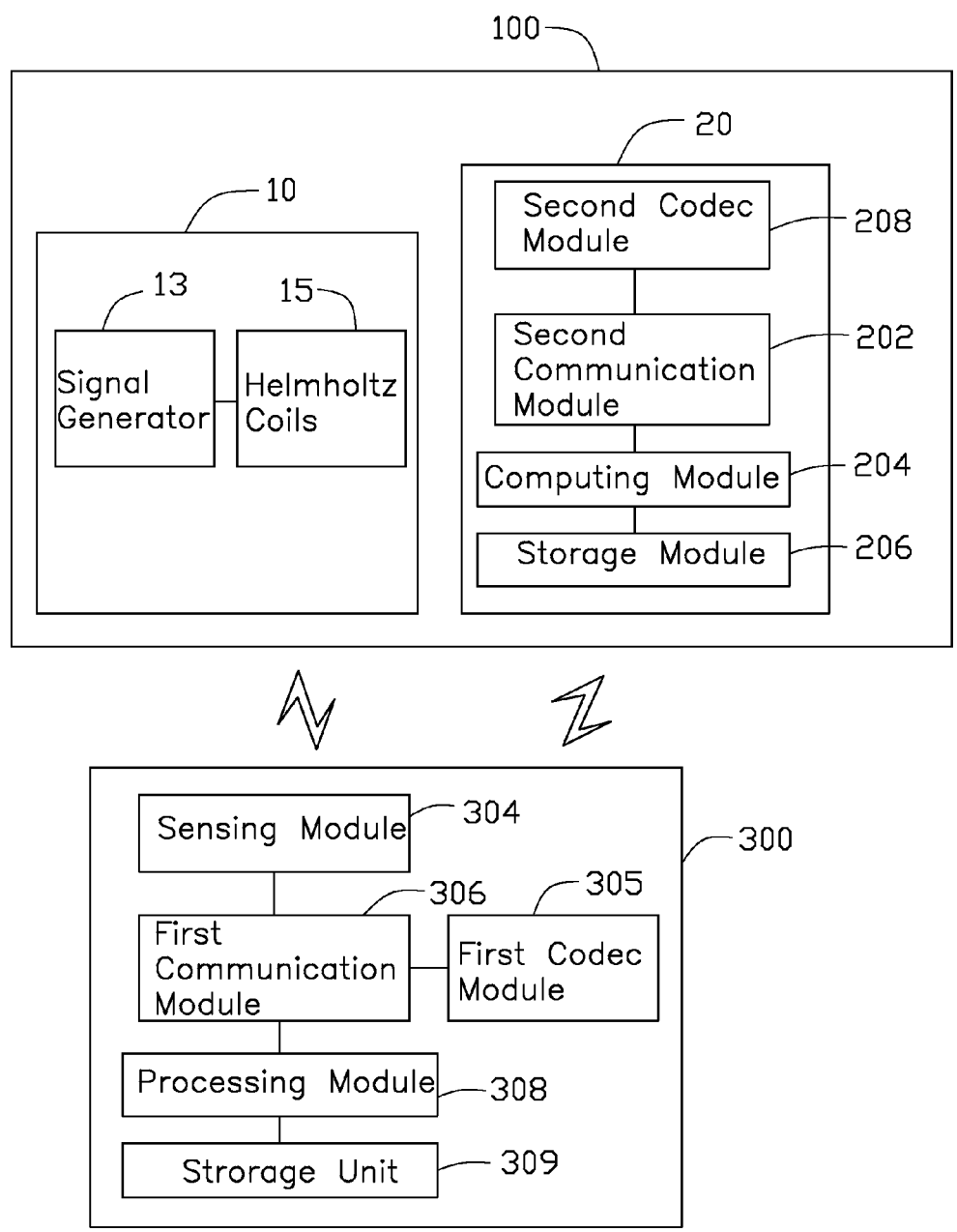
FIG. 1 is a block diagram of one embodiment of a calibration system for induction keys.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

A definition that applies throughout this disclosure will now be presented.

The term "comprising" when utilized, means "including, but not necessarily limited to"; it specifically indicates open-ended inclusion or membership in the so-described combination, group, series and the like.

The present disclosure relates to a calibration system, a calibration method using the calibration system, and an automobile.

FIG. 1 illustrates a calibration system 100 used to calibrate an induction key 300. The calibration system 100 can include a signal source 10 and a computing device 20. The signal source 10 can be adapted for generating and transmitting low frequency (LF) signal and magnetic field to the induction key 300. The computing device 20 can wirelessly communicate with the induction key 300.

In at least one embodiment, the induction key 300 can include a sensing module 304, a first communication module 306, a processing module 308, and a storage unit 309 electrically connected in turn. The sensing module 304 can be adapted for sensing the LF signal and the magnetic field signal, and starting the induction key 300. The first communication module 306 can wirelessly communicate with the computing device 20, such that the magnetic field signal sensed by the induction key 300 can be sent to the computing device 20. In at least one embodiment, the first communication module 306 can be an ultra high frequency (UHF) signal emitter/receiver. The processing module 308 can provide an operational function, for example, the processing module 308 can calculate a magnetic field strength. The storage unit 309 can provide a storage function, for example, the storage unit 309 can used to store an offset value.

The induction key 300 can further include a first codec module 305 electrically connected to the first communication module 306. The first codec module 305 can set up an identification program to validate an identification code received by the first communication module 306. If the identification code is adapted to the identification program, the induction key 300 can match with the device which emit the identification code for receiving signal from the device. If not, the induction key 300 would not match with the device.

In at least one embodiment, the signal source 10 can include a signal generator 13, and helmholtz coils 15 connected to the signal generator 13. The signal generator 13 can be used to generate a LF signal and output corresponding voltage to the helmholtz coils 15. The helmholtz coils 15 can generate an uniform, standard magnetic field. In at least one embodiment, the induction key 300 can be positioned near a center of a shaft of the helmholtz coils 15. The LF signal and the magnetic field can be sensed by the induction key 300 to start the induction key 300.

The computing device 20 can be a computer, a mobile phone or other electronic devices. The computing device 20 can include a second communicating module 202, a computing module 204, and a storage module 206 electrically connected in turn. In at least one embodiment, the storage module 206 can store a standard magnetic field strength generated by the signal source 10. The second communicating module 202 can wirelessly communicate with the first communicating module 304 of the induction key 300, and configured to receive the magnetic field signal sent by the induction key 30. In at least one embodiment, the second communication module 202 can be an UHF signal emitter/receiver. The computing module 204 can be adapted to obtain the magnetic field strength, and compare the magnetic field strength with the standard magnetic field strength, thus an offset value can be obtained. If the offset is not equal to zero, the offset value signal can be sent to the induction key 300 by the second communication module 202, and the offset value can be stored in the induction key 300. When the signal source 10 transmits the LF signal and the magnetic field again, the processing module 308 can obtain a magnetic field strength after calibration based on the magnetic field strength plus the stored offset value. The magnetic field strength signal can be sent to the computing device 20, and the computing device 20 can compare the magnetic field strength to the standard magnetic field strength. The signal generator 10 can generate the magnetic field repeatedly until the magnetic field strength after calibration is consistent with the standard magnetic field strength.

The computing device 20 can further include a second codec module 208 electrically connected to the first communicating module 304. The second codec module 208 can be similar to the first codec module 305. After the second communication module 202 received a first identification code transmitted by the first communication module 304, the second codec module 208 can identify the first identification code. If the second codec module 208 can identify the first identification code, the computing device 20 can match with the induction key 300 to receive the magnetic filed signal transmitted by the induction key 300, and the computing device 20 can send a second identification code to the induction key 300.

Figure 2:
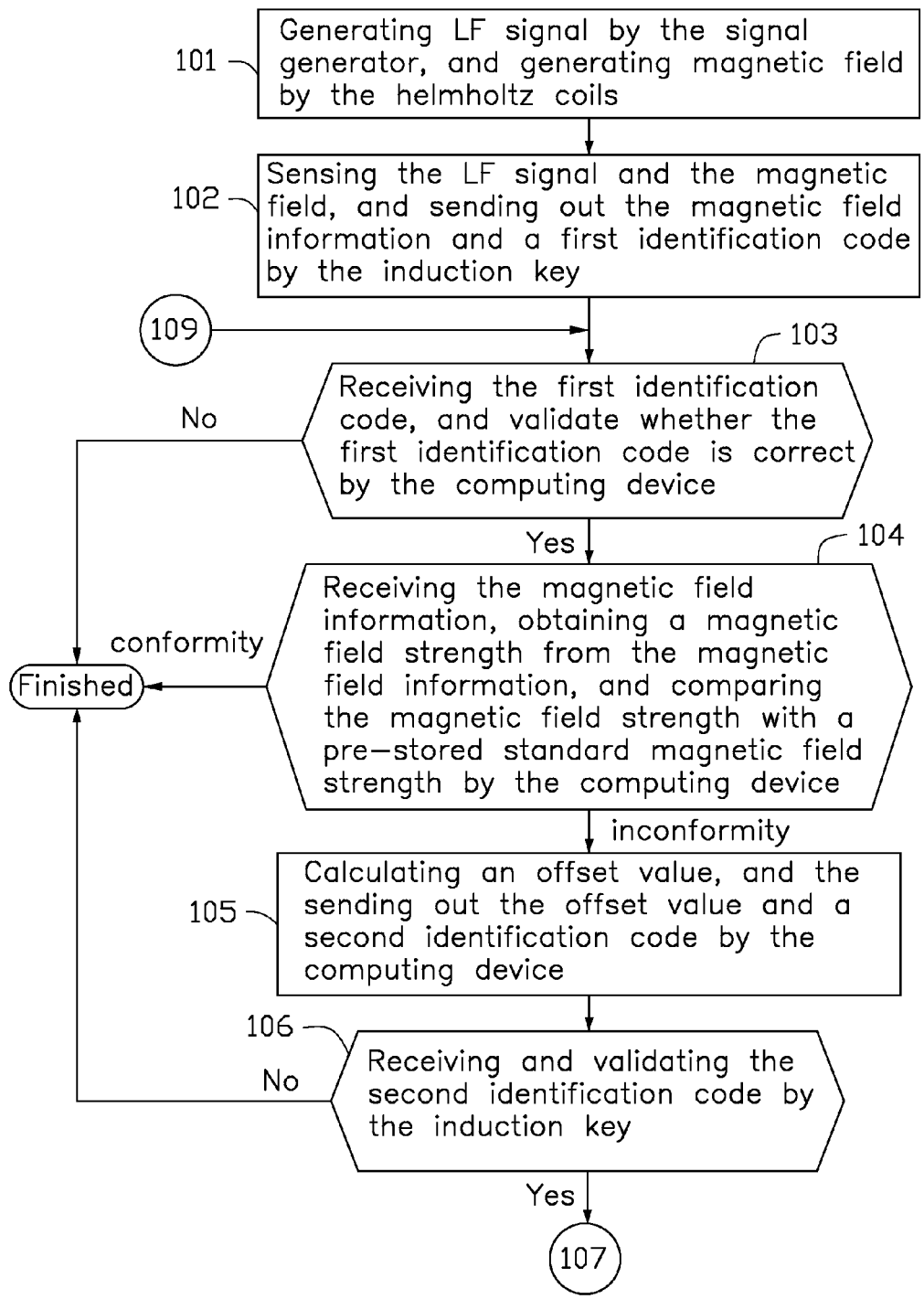
FIGS. 2 and 3 illustrate a flow chart of processing the calibration system in FIG. 1.
Figure 3:
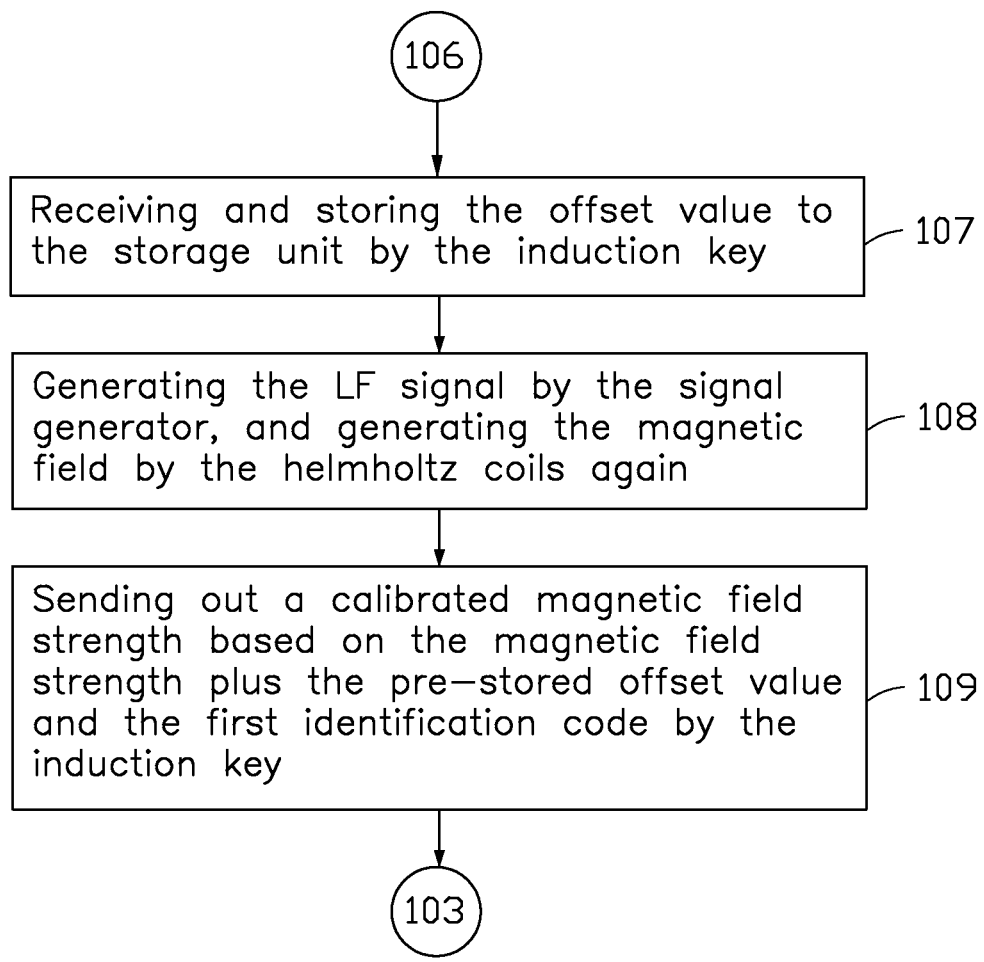

Referring to FIG. 2 and FIG. 3, a flowchart is presented in accordance with an example embodiment of processing the calibration system in FIG. 1. The example method is provided by way of example, as there are a variety of ways to carry out the method. Each block shown in FIG. 2 and FIG. 3 represent one or more processes, methods or subroutines, carried out in the example method. Additionally, the illustrated order of blocks is by example only and the order of the blocks can change according to the present disclosure. The example method can begin from the block 101.

At block 101, the signal generator 13 can emit the LF signal, and the helmholtz coils 15 connected to the signal generator 13 can emit the magnetic field.

At block 102, the sensing module 304 of the induction key 300 can sense the LF signal and start the induction key 300, and the first communication module 306 can send out the magnetic field signal and the first identification code.

At block 103, the second communication module 202 of the computing device 20 can receive the first identification code, and the second codec module 208 can identify the first identification code. If the first identification code is correct, the computing device 20 can match with the induction key 300. If the first identification code is incorrect, the process can be finished.

After the computing device 20 is paired with the induction key 300, the computing device 20 can receive the magnetic signal sent by the first communication module 306. The computing device 204 can process the magnetic signal to obtain the magnetic field strength, and compare the magnetic field strength with the standard magnetic field strength obtained from the storage module 206.

At block 105, if the magnetic field strength is consistent with the standard magnetic field strength, the process can be finished. If not, the computing module 204 can calculate an offset value Y1 between the magnetic field strength and the standard magnetic field strength. The second communication module 202 can send out the offset value and the second identification code.

At block 106, the first communication module 304 can receive the second identification code sent by the second communication module 202, and the first codec module 305 can identify the second identification code.

At block 107, if the induction key 300 can recognize the second identification code, the first communication module 304 of the induction key 300 can receive the offset value Y1 sent by the computing device 20, and store the offset value Y1 to the storage unit 309. If not, the process can be finished.

At block 108, the signal generator 13 can transmit the LF signal again, and the helmholtz coils 15 connected to the signal generator 13 can emit the magnetic field at the same time.

At block 109, the sensing module 304 of the induction key 300 can sense and send the LF signal and the magnetic field to the processing module 308. The processing module 308 can obtain the magnetic field strength, and obtain a magnetic field strength X1 after calibration based on the magnetic field strength value plus the offset value Y1. The first communication module 306 can send out the magnetic field signal and the first identification code.

After that, the process at block 103 to block 109 can be repeated. The computing device 20 can identify the first identification code sent by the induction key 300 and receive the magnetic field signal after calibration. The computing module 204 can obtain the magnetic field strength X1, and compare the magnetic field strength X1 with the standard magnetic field strength. If the magnetic field strength value X1 is consistent with the standard magnetic field strength, the process can be finished. If not, the computing module 204 can calculate an offset value Y2 between the magnetic field strength X1 and the standard magnetic field strength. The second communication module 202 can send out the offset value Y2 and the second identification code. The induction key 300 can identify the second identification code, and the first communication module 306 can receive and store the offset value Y2 to the storage unit. At this time, the offset value Y2 can replace the offset value Y1, and the signal generator 10 can generate the LF signal and magnetic field repeatedly, until the magnetic field Xn can be consistent with the standard magnetic field, and the process can be finished.

In the calibration system and the calibration method of this disclosure, the signal generator 10 can generate the magnetic field, and the induction key 300 can sense and send the magnetic filed signal to the computing device 20, such that the computing device 20 can compare the magnetic filed strength to the standard magnetic filed strength, and obtain an offset value. When the signal generator 10 generates the magnetic field again, the calibration system can enable the induction key 300 to obtain a calibrated magnetic filed strength based on the offset value. Therefore, the accuracy and stability of sensing the signal by the induction key 300 can be improved.

In other embodiments, the first codec module 305 and the second codec module 208 can be omitted, and the induction key 300 can exchange information with the computing device through the first communication module 306 and the second communication module 202

The calibration system 100 can calibrate two or more induction keys 300 at the same time.

The embodiments shown and described above are only examples. Many details are often found in the art such as the other features of an induction key, a calibration system, and a calibration method. Therefore, many such details are neither shown nor described. Even though numerous characteristics and advantages of the present technology have been set forth in the foregoing description, together with details of the structure and function of the present disclosure, the disclosure is illustrative only, and changes may be made in the detail, especially in matters of shape, size and arrangement of the parts within the principles of the present disclosure up to, and including, the full extent established by the broad general meaning of the terms used in the claims. It will therefore be appreciated that the embodiments described above may be modified within the scope of the claims.

What is claimed is:

1. A calibration system for an induction key comprising:
   a signal source configured to generate a low frequency (LF) signal and a magnetic field signal at intervals, the LF signal being configured to be sensed by the induction key for starting the induction key, and the induction key being configured to send the magnetic field signal;
   a computing device comprising:
     a communication module configured to wirelessly communicate with the induction key for receiving the magnetic field signal;
     a computing module configured to obtain a magnetic field strength from the magnetic field signal, calculate a first offset value between the magnetic field strength and a standard magnetic field strength, and
     a storage module configured to store the standard magnetic field strength;
     wherein the communication module, the computing module, and the storage module are electrically connected in turn;
     wherein if the first offset value is not zero, the first offset value is sent by the communication module and stored in the communication module;
     wherein when the signal source sends out the LF signal and the magnetic field again, the induction key sends out a magnetic field strength after calibration based on the magnetic field strength the induction key sensed plus the first offset value, and the computing device calculates a second offset value between the magnetic field strength after calibration and the standard magnetic field strength; and
     wherein the signal generator generates the magnetic field repeatedly until the magnetic field strength after calibration is consistent with the standard value.

2. The calibration system as claimed in claim 1,
   wherein the signal source comprises a signal generator and helmholtz coils connected to the signal generator;
   wherein the signal generator is configured to generate the LF signal and outputting corresponding voltage to the helmholtz coils; and
   wherein the helmholtz coils are configured to generate uniform magnetic filed.

3. The calibration system as claimed in claim 1, wherein the computing device comprises a codec module electrically connected to the communication module, and the codec module is configured to validate whether the computing device is paired with the induction key.

4. A calibration method for an induction key comprising:
   generating a LF signal and a corresponding magnetic field signal at intervals by a signal source;
   receiving the magnetic field signal by a computing device after the LF signal and the magnetic field are sensed by the induction key, obtaining a magnetic field strength from the magnetic field signal, and comparing the magnetic field strength to a pre-stored standard magnetic field value;
   calculating an offset value and the sending out the offset value to the induction key by the computing device; and
   generating the LF signal and the magnetic field again by the signal source, sending out the magnetic field strength after calibration based on the magnetic field strength plus the first offset value by the induction key, and comparing the magnetic field strength after calibration with the standard magnetic field strength by the computing device, until the calibrated magnetic field strength is consistent with the standard value.

5. The calibration method as claimed in claim 4, wherein the signal source comprises a signal generator and helmholtz coils connected to the signal generator; and the step of generating LF signal and magnetic filed includes generating the LF signal and outputting corresponding voltage to the helmholtz coils, and generating uniform magnetic filed by the helmholtz coils.

6. The calibration method as claimed in claim 4, wherein after the signal source generates the LF signal and the magnetic filed, the computing device receives a first identification code transmitted by the induction key, and encode the first identification code to validate whether the computing device is paired with the induction key.

7. An induction key worked with a calibration system, the induction key comprising:
   a sensing module configured to sense a LF signal and a magnetic field signal generated by a signal source of the calibration system and start the induction key;
   an induction key communication module configured to wirelessly communicate with a computing module of the calibration system, the computing module being configured to obtain a magnetic field strength from the magnetic field signal and calculate offset values between the magnetic field strength and a standard magnetic field strength;
   a processing module, and
   a storage unit configured to store the offset values received by the induction key;
   wherein the processing module is electrically connected between the induction key communication module and the storage unit; and
   wherein the processing module is configured to obtain a magnetic field value after calibration based on the magnetic field sensed by the induction key plus a previous stored offset value when the signal source generates the LF signal and the magnetic field signal again.

* * * * *